United States Patent
Narita

(10) Patent No.: US 7,472,558 B1
(45) Date of Patent: Jan. 6, 2009

(54) METHOD OF DETERMINING OPTIMAL AIR CONDITIONER CONTROL

(75) Inventor: Izuru Narita, Yamato (JP)

(73) Assignee: International Business Machines (IBM) Corporation, Armonk, NY (US)

( * ) Notice: Subject to any disclaimer, the term of this patent is extended or adjusted under 35 U.S.C. 154(b) by 0 days.

(21) Appl. No.: 12/103,516

(22) Filed: Apr. 15, 2008

(51) Int. Cl.
 F25B 7/00 (2006.01)
 F25D 23/12 (2006.01)
 G01M 1/38 (2006.01)
 G05D 23/00 (2006.01)
 F28D 15/00 (2006.01)

(52) U.S. Cl. .................. 62/175; 62/259.2; 700/300; 700/278; 165/104.33

(58) Field of Classification Search .................. 62/175, 62/180, 199, 259.2; 700/286, 300, 276–278, 700/291, 295, 299; 702/188, 132; 361/687; 165/80.2, 80.3, 80.4, 80.5, 104.33, DIG. 48; 236/113, DIG. 8; 454/184, 187, 229, 239
See application file for complete search history.

(56) References Cited

U.S. PATENT DOCUMENTS

| | | | |
|---|---|---|---|
| 5,963,887 A | 10/1999 | Giorgio | |
| 6,681,154 B2 | 1/2004 | Nierlich et al. | |
| 6,718,277 B2 | 4/2004 | Sharma | |
| 6,813,897 B1 | 11/2004 | Bash et al. | |
| 6,873,883 B2 | 3/2005 | Ziarnik | |
| 7,010,392 B2 | 3/2006 | Bash et al. | |
| 7,031,870 B2 | 4/2006 | Sharma et al. | |
| 7,061,763 B2 | 6/2006 | Tsoi | |
| 7,197,433 B2 | 3/2007 | Patel et al. | |
| 7,210,048 B2 | 4/2007 | Bodas | |
| 7,216,021 B2 | 5/2007 | Matsubara et al. | |
| 7,218,996 B1 | 5/2007 | Beitelmal et al. | |
| 7,251,547 B2 | 7/2007 | Bash et al. | |
| 7,313,924 B2 | 1/2008 | Bash et al. | |
| 7,315,768 B2 | 1/2008 | Dang et al. | |
| 7,365,973 B2 | 4/2008 | Rasmussen et al. | |
| 2003/0128509 A1 | 7/2003 | Outdet | |
| 2003/0193777 A1 | 10/2003 | Friedrich et al. | |
| 2005/0023363 A1 | 2/2005 | Sharma et al. | |

(Continued)

OTHER PUBLICATIONS

*A Design Guidelines Sourcebook*, "High Performance Data Centers," Pacific Gas and Electric Company, Jan. 2006.

(Continued)

Primary Examiner—Chen-Wen Jiang
(74) Attorney, Agent, or Firm—Wenderoth, Lind & Ponack, L.L.P.

(57) ABSTRACT

A method of determining optimal air conditioner control is provided that includes determining power consumptions of servers and computer room air conditioners, calculating a number of calories processed by each air conditioner and determining a total number of calories processed as a total heat processed load. Moreover, the method includes determining relevant factors between each of the servers and each of the air conditioners, calculating a percentage of the total heat processed load for each air conditioner, adjusting the corresponding percentage of the total heat processed load for each air conditioner using an operating efficiency curve, calculating a respective power to be consumed by each air conditioner, calculating an efficiency value, determining whether the efficiency value is a maximum efficiency value, and setting each air conditioner at the respective power to be consumed when the efficiency value is the maximum efficiency value.

1 Claim, 3 Drawing Sheets

U.S. PATENT DOCUMENTS

| | | |
|---|---|---|
| 2005/0228618 A1 | 10/2005 | Patel et al. |
| 2005/0267639 A1 | 12/2005 | Sharma et al. |
| 2005/0278069 A1* | 12/2005 | Bash et al. ............... 700/276 |
| 2005/0278070 A1 | 12/2005 | Bash et al. |
| 2006/0080001 A1 | 4/2006 | Bash et al. |
| 2006/0168975 A1 | 8/2006 | Malone et al. |
| 2006/0214014 A1 | 9/2006 | Bash et al. |
| 2007/0078635 A1 | 4/2007 | Rasmussen et al. |
| 2007/0089446 A1 | 4/2007 | Larson et al. |
| 2007/0097636 A1 | 5/2007 | Johnson et al. |
| 2007/0167125 A1 | 7/2007 | Rasmussen et al. |
| 2007/0213881 A1 | 9/2007 | Belady et al. |
| 2008/0004837 A1 | 1/2008 | Zwinger et al. |

OTHER PUBLICATIONS

J.D. Miller et al., *Energy Star® Partnerships Program*, "Estimates of Refrigerator Loads in Public Housing Based on Metered Consumption Data", Oct. 1998.

* cited by examiner

METHOD OF DETERMINING OPTIMAL AIR CONDITIONER CONTROL

BACKGROUND OF THE INVENTION

This invention relates generally to the power required to cool computer rooms, and more particularly, to a method of determining optimal air conditioner control.

Known computer rooms generally include computer systems and components, such as servers, that generate heat. Because heat generated by the computer systems may cause the computer room's temperature to increase beyond a desirable range, air conditioning units are generally used to cool computer rooms to within the desired temperature range.

Computer room air conditioners (CRAC) generally include coiled pipes and fans. During operation, chilled water from a container located outside of the computer room is circulated though a cooling system and into the coiled pipes. The air conditioning units operate by using the fans to blow air around the coiled pipes and into the computer room. Because the temperature of the chilled water is constant, the power required to cool the computer room may be adjusted by changing the amount of chilled water circulated through the coiled pipes, or adjusting the rate of the fan.

At least one known approach for controlling the amount of power required by air conditioners to cool computer rooms includes measuring the power output load of the air conditioners and power consumption of the servers. However, because known approaches do not power the air conditioners efficiently, additional costs are incurred in cooling the computer rooms.

SUMMARY OF THE INVENTION

A method of determining optimal air conditioner control is provided. The method includes determining a power consumption of each of a plurality of servers and a power consumption of each of a plurality of computer room air conditioners, and calculating a number of calories processed by each air conditioner and determining a total number of calories processed as a total heat processed load. Moreover, the method includes determining relevant factors between each of the servers and each of the air conditioners, where each relevant factor represents a percentage of a total cooling effect on one of the servers due to one of the air conditioners. Furthermore, the method includes calculating a percentage of the total heat processed load for each air conditioner, distributing a heat processed load to each air conditioner using a corresponding percentage of the total heat processed load, adjusting the corresponding percentage of the total heat processed load for each air conditioner using an operating efficiency curve, calculating a respective power to be consumed by each air conditioner, calculating an efficiency value, determining whether the efficiency value is a maximum efficiency value, and setting each air conditioner at the respective power to be consumed when the efficiency value is the maximum efficiency value.

DETAILED DESCRIPTION OF THE INVENTION

Figure 1:
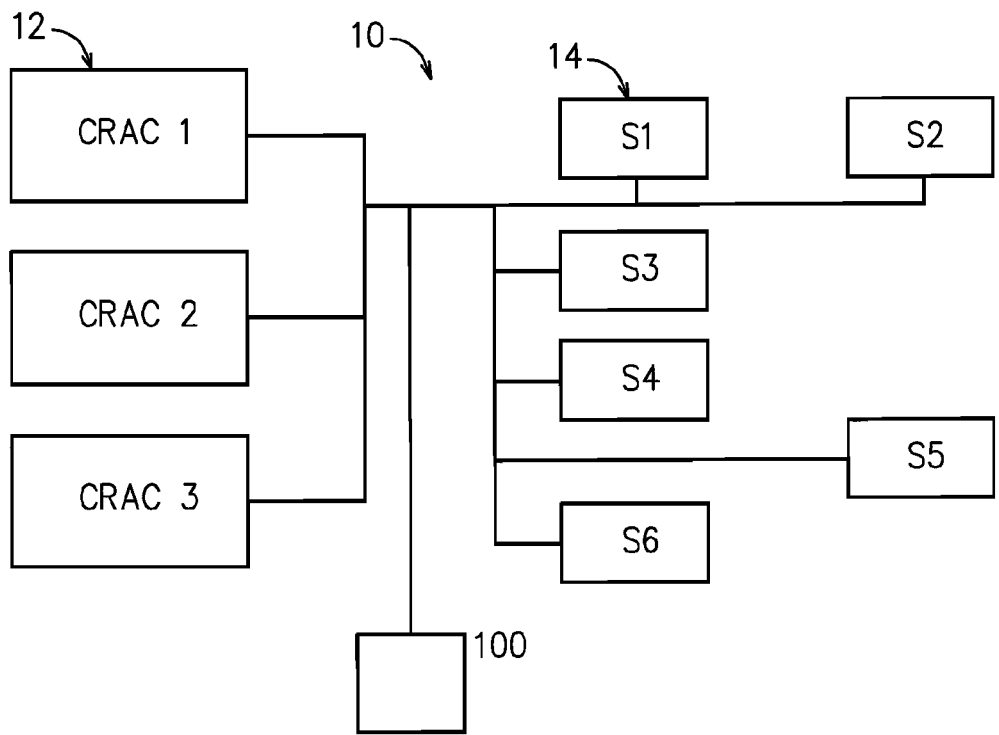
FIG. 1 is a schematic illustration of an exemplary computer room.

FIG. 1 is a schematic illustration of an exemplary computer room 10 that may include three computer room air conditioners CRAC 1, CRAC 2, CRAC 3, collectively referred to as CRAC 12, six servers S1-S6, collectively referred to as servers 14, and an exemplary control logic and system controller 100. The CRACs 12 cool the computer room when it is heated by the servers 14.

It should be appreciated that in the exemplary embodiment, CRACs 12 are the same type of air conditioner, and thus have substantially similar operating characteristics. However, it should be understood that other embodiments may include any number of CRACs 12 and that each CRAC 12 may be a different type. Accordingly, in these other embodiments, CRACs 12 may each have different operating characteristics.

Moreover, in the exemplary embodiment, each of the servers 14 consumes 1000W of electrical power during operation. However, in other embodiments each server 14 may consume a different amount of electrical power during operation.

Figure 2:
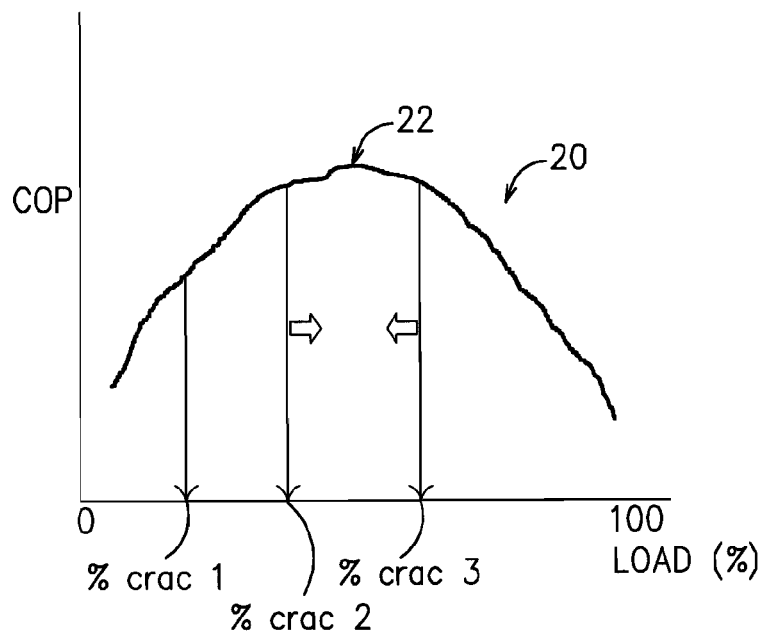
FIG. 2 is a graph representing the operating efficiency of an air conditioner.

FIG. 2 is a graph 20 representing the operating efficiency of each CRAC 12 as a function of percentage of the output load of each CRAC 12 and CRAC 12 efficiency. The vertical axis represents the efficiency (COP: Coefficient of Performance) of each CRAC 12, and in the exemplary embodiment is determined by dividing the number of calories that can be processed, by the power consumed by a single CRAC 12. Moreover, the horizontal axis of graph 20 represents the percentage of each CRAC's 12 rated value. For example, if CRAC 1 has a rated heat processing value of 3000W and processes 1800W, then the % crac 1 as shown on the horizontal axis should be 60% (i.e., 1800W/3000W). Thus, % crac 1, % crac 2 and % crac 3 represent percentages of the rated values of each of CRAC 1, CRAC 2 and CRAC 3, respectively. By adjusting the power consumed by each of the CRACs 12, the percentages of their rated heat processing values may be adjusted such that the percentage rated heat processing values % crac 1, % crac 2 and % crac 3 move towards a maximum point 22 of the graph 20. Doing so facilitates determining the combination of CRAC 12 power consumptions which maximizes the ratio of power consumption of all servers 14 to the power consumption of all CRACs 12. Because the CRACs 12 have the same operating characteristics in the exemplary embodiment, they also have the same operating efficiency curve 20 and may be shown together on the same graph 20 as shown in FIG. 2. However, it should be appreciated that in other embodiments where the CRACs 12 are different from each other, the operating efficiency curves for each CRAC 12 may be different.

Figure 3:
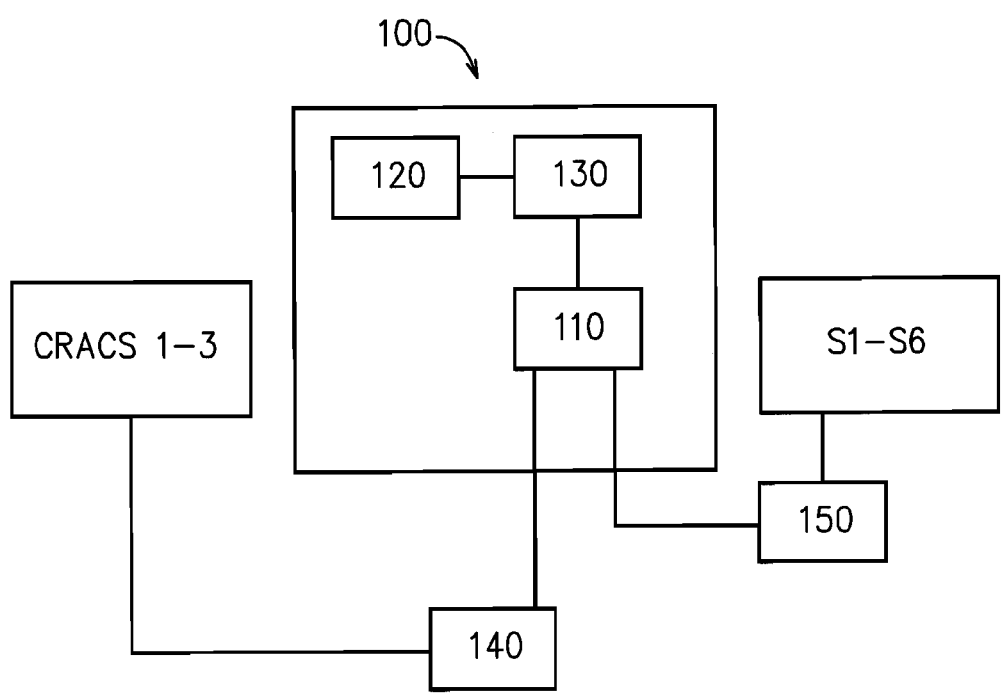
FIG. 3 is a block diagram illustrating an exemplary control logic and system controller.

FIG. 3 is a block diagram illustrating the exemplary control logic and system controller 100 for use in determining the combination of CRAC 12 power consumptions that maximizes the ratio of electrical power consumption of all servers 14 to the power consumption of all CRACs 12. In the exemplary embodiment, controller 100 may include an input-output circuit 110, a memory 120 and a processing circuit 130.

It should be understood that the circuits shown in FIG. 3 may be implemented as individual devices or as portions of a suitably programmed general purpose processor. As used herein, the term "processor" may include, but is not limited to, any programmable system including systems using microcontrollers, reduced instruction set circuits (RISC), application specific integrated circuits (ASICs), logic circuits, and any other circuit or processor capable of executing the functions described herein.

Moreover, in the exemplary embodiment, each CRAC 12 may include a CRAC sensor 140 for monitoring and measuring the power consumption of its corresponding CRAC 12 and for generating a signal representing the power consumption measurement. Furthermore, each sensor 14 may include a server sensor 150 for monitoring and measuring the power consumption of its corresponding server 14 and for generating a signal representing the power consumption measurement. Additionally, the sensors 140 and 150 communicate with the controller 100 by transmitting their respective signals to the input/output circuit 110. The input/output interface circuit 110 is for receiving the signals transmitted to controller 100 from the sensors 140 and 150, and is for outputting signals produced by the controller 100.

Memory 120 may be implemented using any appropriate combination of alterable, volatile or non-volatile memory or non-alterable, or fixed, memory. Moreover, the memory 120 may include one or more of a CRACs power consumption portion, a server power consumption portion, an operating efficiency curve portion, and a relevant factor portion. The CRAC power consumption portion is for storing the power consumed by each CRAC 12 as measured by the sensors 140. The server power consumption portion is for storing the power consumed by each server 14 as measured by the sensors 150, and the efficiency curve portion is for storing the operating efficiency curve 20. The relevant factor portion is for storing relevant factors that represent a percentage of the total cooling effect on a given server 14 due to a given CRAC 12.

In the exemplary embodiment, processing circuit 130 determines the combination of CRAC 12 power consumptions that maximizes the ratio of the power consumption of all the servers 14 to the power consumption of all CRACs 12, and adjusts the power consumption of each CRAC 12 accordingly.

Figure 4:
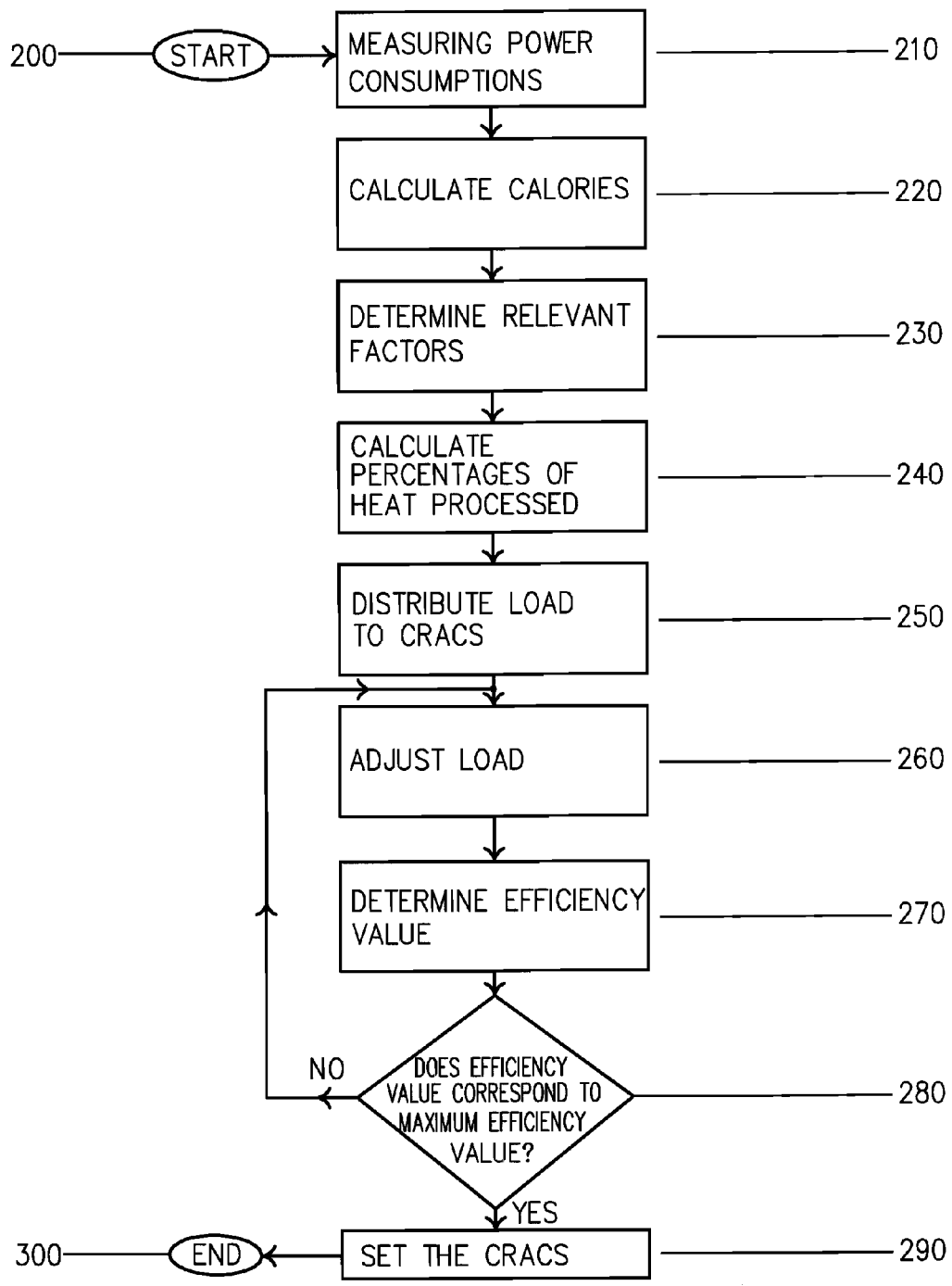
FIG. 4 is a flowchart illustrating an exemplary method for determining optimal air conditioner control.

FIG. 4 is a flowchart illustrating an exemplary method for determining the combination of CRAC 12 power consumptions that maximizes the ratio of the power consumption of all the servers 14 to the power consumption of all CRACs 12. The method starts 200 by measuring the power consumption 210 of each CRAC 12 and the power consumption of each server 14. After determining the server power consumptions, the number of calories processed by each CRAC 12 is determined 220 and they are added together to determine a total number of calories processed as a total heat processed load by the CRACS 12. Next, the relevant factors are determined 230 for the CRACs 12 and servers 14. Table 1 is provided below and shows examples of relevant factors between each CRAC 12 and each server 14.

TABLE 1

|    | S1  | S2  | S3  | S4  | S5  | S6  |
|----|-----|-----|-----|-----|-----|-----|
| C1 | 0.3 | 0.7 | 0.5 | 0.1 | 0.2 | 0.0 |
| C2 | 0.4 | 0.2 | 0.3 | 0.1 | 0.7 | 0.3 |
| C3 | 0.3 | 0.1 | 0.2 | 0.8 | 0.1 | 0.7 |

As shown, for example, the relevant factor of CRAC 1 with respect to server S3 is C1=0.5, the relevant factor of CRAC 2 with respect to server S2 is C2=0.2, and the relevant factor of CRAC 3 with respect to server S4 is C3=0.8. After determining the relevant factors 230, the percentage of the total heat processed for each CRAC 12 is determined 240.

Calculating the percentage of the total heat processed begins by multiplying, for each CRAC 12, each relevant factor by the power consumption of the corresponding server 14. For example, multiplying the relevant factor C1 (0.5) of CRAC 1 by the electrical power consumed by server S3 (1000W) determines the heat (i.e., the load to the CRAC expressed in calories) processed by CRAC 1 due to server S3 as (0.5)×(1000W)=500W. Likewise, multiplying the relevant factor C1 (0.7) of CRAC 1 by the electrical power consumed by server S2 (1000W) determines the heat processed by CRAC 1 due to server S2 as (0.7)×(1000)=700W.

In the exemplary embodiment the power consumption of each server 14 is 1000W. Thus, adding the relevant factors for a given CRAC 12 and multiplying the sum by the power consumption of the servers 14 determines the total power consumption of CRAC 1. That is, CRAC 1 load=(1000W)×(0.3+0.7+0.5+0.1+0.2+0.0)=(1.8)×(1000W)=1800W. Likewise, the total heat processed by CRAC 2 and CRAC 3 may be determined as CRAC 2 load=(1000W)×(0.4+0.2+0.3+0.1+0.7+0.3)= (2.0)×(1000W)=2000W, and CRAC 3 load=(1000W)×(0.3+0.1+0.2+0.8+0.1+0.7)= (2.2)×(1000W)=2200W, respectively. Dividing the heat processed by each CRAC 12 by the total heat processed determines the percentage of the total heat processed by each CRAC 12. Because there are six servers 14 that each consume 1000W of electrical power, the total heat processed by the CRACs 12 is 6000W. Thus, the percentage of the total heat processed % CRAC 1, % CRAC 2 and % CRAC 3, as well as the corresponding percentage heat processing values % crac 1, % crac 2 and % crac 3 are determined 240 for each CRAC 12 as follows:

| % CRAC 1 = 1800 W/6000 W = 0.30, | % crac 1 = 1800 W/3000 W = 0.6 |
| % CRAC 2 = 2000 W/6000 W = 0.33, | % crac 2 = 2000 W/3000 W = 0.66 |
| % CRAC 3 = 2200 W/6000 W = 0.367, | % crac 3 = 2200 W/3000 W = 0.73. |

The controller 100 distributes 250 the total heat processed to the CRACs 12 using the percentages of the total heat processed computed for each CRAC 12. The operating efficiency curve 20 is used as a basis for adjusting the CRAC 12 percentages of heat processed % crac 1, % crac 2 and % crac 3 to optimally distribute the total power consumed between the CRACs 12. In the exemplary embodiment, referencing FIG. 2, adjusting 260 the percentages of heat processed % crac 1, % crac 2 and % crac 3 includes moving the percentages of heat processed as close as possible to the maximum point 22 of graph 20. For example, adjusting % crac 3 may include a reduction and adjusting % crac 2 may include an increase. The power consumed by each CRAC 12 is determined 260 by dividing the heat processed by each CRAC 12 by a corresponding COP value from FIG. 2, and is applied by opening or closing solenoid valves of the CRACs 12 or changing the rates of the fans. Next, dividing the total amount of electrical power consumed by the servers 14 by the total power consumed by the CRACs 12 determines an efficiency value 270. Then, a determination is made 280 deciding whether the efficiency value is a maximum efficiency value. If the efficiency value is the maximum efficiency value, then the CRACs 12 are set 290 at the determined power consumptions and processing ends 300. Otherwise, processing continues 260.

In an example illustrating the exemplary embodiment of the invention, the CRAC 12 power consumptions were determined 260 for four different cases to yield four different efficiency values 270, respectively. As shown below in Table 2, the power consumed by each CRAC 12 was determined 260 for each case and an efficiency value determined.

TABLE 2

|  | Case 1 | Case 2 | Case 3 | Case 4 |
|---|---|---|---|---|
| CRAC 1 | 1250 W | 1275 W | 1250 W | 1225 W |
| CRAC 2 | 1000 W | 830 W | 1058 W | 1000 W |
| CRAC 3 | 750 W | 750 W | 1025 W | 933 W |
| Efficiency Value | 2 | 2.1 | 1.8 | 1.9 |

For each case, the total power consumed by the servers 14 was assumed to be 6000W. The efficiency values were determined as described above 270. Specifically, for case 1 the CRAC 12 power consumption totaled 3000W (i.e., 1250W+1000W+750W=3000W) and the efficiency value was computed as 6000W/3000W=2. For case 2, the CRAC power consumption totaled 2855W (i.e., 1275W+830W+750W=2855W) and the efficiency value was computed as 6000W/2855W=2.1. The efficiency values for cases 3 and 4 were determined in a similar fashion. Case 2 has the maximum efficiency value 280, so the CRACs 12 are set to the power consumption values shown for Case 2. Thus, an optimal ratio of the power consumption of the CRACs 12 is determined as 1275/830/750, which yields the optimal ratio of server power consumption to CRAC power consumption.

A ratio of the power consumption of the servers 14 to the power consumption of CRACs 12 is determined that optimizes power usage for cooling a computer room 10. The ratio among the power consumptions from the CRACs 12 may be any ratio that facilitates maximizing the ratio of power consumption of all the servers 14 to the power consumption of all the CRACs 12.

Furthermore, the present invention can be directed to a system or an apparatus for determining optimal air conditioner control. In addition, the present invention can also be implemented as a program for causing a computer to determine optimal air conditioner control. The program can be distributed via a computer-readable storage medium such as a CD-ROM.

While the invention has been described in terms of various specific embodiments, those skilled in the art will recognize that the invention can be practiced with modification within the spirit and scope of the claims.

The invention is claimed as follows:

1. A method of determining optimal air conditioner control comprising:
   determining a power consumption of each of a plurality of servers and a power consumption of each of a plurality of computer room air conditioners;
   determining relevant factors between each of the servers and each of the air conditioners, wherein each relevant factor represents a percentage of a total cooling effect on one of the servers due to one of the air conditioners;
   calculating a number of calories processed by each air conditioner using the determined relevant factors and determining a total number of calories processed as a total heat processed load;
   calculating a percentage of the total heat processed load for each air conditioner by dividing the number of calories processed by each air conditioner by the total heat processed load;
   distributing a heat processed load to each air conditioner using a corresponding percentage of the total heat processed load;
   adjusting the corresponding percentage of the total heat processed load for each air conditioner using an operating efficiency curve;
   calculating a respective power to be consumed by each air conditioner by dividing the number of calories processed by each air conditioner by a corresponding coefficient of performance value;
   calculating an efficiency value by dividing a total power consumed by the servers by a total power consumed by the air conditioners;
   determining whether the efficiency value is a maximum efficiency value; and
   setting each air conditioner at the respective power to be consumed when the efficiency value is the maximum efficiency value.

* * * * *